US010326097B1

(12) United States Patent
Xia et al.

(10) Patent No.: US 10,326,097 B1
(45) Date of Patent: Jun. 18, 2019

(54) DISPLAY PANEL PREPARATION METHOD, DISPLAY PANEL AND DISPLAY DEVICE

(71) Applicant: Wuhan China Star Optoelectronics Semiconductor Display Technology Co., Ltd., Wuhan, Hubei (CN)

(72) Inventors: Cunjun Xia, Guangdong (CN); Simin Peng, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/979,292

(22) Filed: May 14, 2018

Related U.S. Application Data

(63) Continuation of application No. PCT/CN2018/072737, filed on Jan. 15, 2018.

(30) Foreign Application Priority Data

Dec. 29, 2017 (CN) .......................... 2017 1 1487828

(51) Int. Cl.
| | | |
|---|---|---|
| H01L 27/32 | (2006.01) | |
| H01L 51/00 | (2006.01) | |
| H01L 51/52 | (2006.01) | |
| H01L 51/56 | (2006.01) | |

(52) U.S. Cl.
CPC ...... *H01L 51/5206* (2013.01); *H01L 27/3246* (2013.01); *H01L 51/0097* (2013.01); *H01L 51/5221* (2013.01); *H01L 51/5253* (2013.01); *H01L 51/56* (2013.01)

(58) Field of Classification Search
CPC .... H01L 27/3246; H01L 51/522; H01L 51/56
USPC .......................................................... 257/40
See application file for complete search history.

(56) References Cited

U.S. PATENT DOCUMENTS

2005/0062414 A1    3/2005  Hsiao et al.

FOREIGN PATENT DOCUMENTS

| CN | 106129267 A | 11/2016 |
| CN | 106981584 A | 7/2017 |
| CN | 107123751 A | 9/2017 |
| CN | 107204404 A | 9/2017 |
| CN | 107394059 A | 11/2017 |

*Primary Examiner* — Elias Ullah
(74) *Attorney, Agent, or Firm* — Hauptman Ham, LLP

(57) ABSTRACT

The present disclosure provides a display panel including a substrate, an anode on the substrate, a pixel defining layer on the anode, a light-emitting layer on the pixel defining layer, a first organic layer on the light-emitting layer and an inorganic layer on surfaces of the plurality of pixel walls in the pixel defining layer and the first organic layer. The pixel defining layer includes a plurality of pixel walls and pixel defining areas. The light-emitting layer is in the pixel defining areas and covering the anode. The first organic layer includes a plurality of first protrusions. The inorganic layer includes a plurality of second protrusions, the second protrusions are located on a side of the inorganic layer away from the first organic layer, and each of the second protrusions corresponds to each of the first protrusions. A display panel preparation method and a display device are further provided.

12 Claims, 4 Drawing Sheets

DISPLAY PANEL PREPARATION METHOD, DISPLAY PANEL AND DISPLAY DEVICE

RELATED APPLICATIONS

This application is a continuation application of PCT Patent Application No. PCT/CN2018/072737, filed Jan. 15, 2018, which claims the priority benefit of Chinese Patent Application No. 201711487828.4, filed Dec. 29, 2017, which is herein incorporated by reference in its entirety.

FIELD OF THE DISCLOSURE

The present disclosure relates to a display technology field, and more particularly to a display panel preparation method, a display panel and a display device.

BACKGROUND OF THE DISCLOSURE

Compared with the liquid crystal display (LCD), the active matrix organic light-emitting diode (AMOLED) display panel has the advantages of high contrast, viewing angle and moving image response speed, and has aroused people's widespread attention and development. With the expansion of the field of OLED applications, the new application field more needs the flexible OLED display, at the same time OLED flexible display will have more and more requirements such as: OLED display life, bending radius, bending times, etc.; OLED flexible display will require the packaging of the OLED device needs thinning.

Now the mainstream of thin film packaging technology uses inorganic film, organic film and other forms of mashup to achieve OLED water and oxygen barrier device, However, the introduction of thin-film encapsulation has an impact on the light-emitting efficiency of the OLED panel. Because the layers of the thin film encapsulation such as the organic thin film layer and the inorganic layer have different refractive indexes, microgrooves are formed between the cathode and the anode of the OLED. The light emitted by the OLED can interfere in these microgrooves, thereby reducing the light efficiency of the OLED and showing that the CIE of the light can be shifted, resulting in poor display quality of the OLED.

SUMMARY OF THE DISCLOSURE

An object of the present disclosure is to provide a display panel preparation method, wherein an organic layer having a microstructure is formed on the light-emitting layer to eliminate the interference effect of microgrooves encapsulated by the thin film on the light emitted by the OLED and improve the display quality of the display panel.

The present disclosure also provides a display panel and a display device.

The display panel preparation method of the present disclosure is used for preparing a display panel, including:
providing a substrate;
forming an anode on the substrate and a pixel defining layer stacked on the anode, wherein the pixel defining layer includes a plurality of pixel walls and pixel defining areas between every two of the pixel walls, and the anode exposes the pixel defining areas;
forming a protection layer on the pixel defining layer, wherein the protection layer includes a plurality of protection walls arranged at intervals, and protection areas is provided between every two adjacent protection walls, each of the protection walls corresponds to one of the pixel walls and located on the surface of the pixel wall, the orthogonal projection of the protection wall on the pixel wall completely covers the pixel wall, the protection areas are in one-to-one correspondence with the pixel defining areas;
forming a light-emitting layer on the pixel defining layer, the light-emitting layer being located in the pixel defining areas and covering the anode;
forming a first organic layer on the light-emitting layer, wherein a plurality of first protrusions are formed on the surface of the first organic layer;
removing the protection layer; and
depositing an inorganic layer on the surfaces of the plurality of the pixel walls of the pixel defining layer and on the first organic layer.

The display panel preparation method further includes:
etching a microgroove on the inorganic layer at the center of the pixel wall; and
forming a second organic layer on the inorganic layer covering the microgroove.

In the step of depositing an inorganic layer on the surfaces of the plurality of the pixel walls of the pixel defining layer and on the first organic layer, the inorganic layer is formed by plasma enhanced chemical vapor deposition, atomic layer deposition or physical deposition, wherein a plurality of second protrusions are formed on the surface of the inorganic layer away from the first organic layer, and each of the second protrusions corresponds to each of the first protrusions.

In the step of forming an anode on the substrate and a pixel defining layer stacked on the anode, further includes:
forming a metal layer on the substrate and patterning the metal layer to form the anode, wherein the anode includes a plurality of grooves arranged at intervals; and
depositing the pixel defining layer on the anode, wherein the pixel wall covers the groove and protrudes from the anode.

In the step of forming a first organic layer on the light-emitting layer, the first organic layer is formed by inkjet printing technique.

In the step of removing the protection layer, the protection layer is removed by a demolding process.

The display panel of the present disclosure includes:
a substrate;
an anode on the substrate, and a pixel defining layer stacked on the anode, the pixel defining layer includes a plurality of pixel walls and pixel defining areas between every two of the pixel walls, and the anode exposes the pixel defining areas;
a light-emitting layer on the pixel defining layer, the light-emitting layer being located in the pixel defining areas and covering the anode;
a first organic layer on the light-emitting layer, the first organic layer including a plurality of first protrusions; and
an inorganic layer on surfaces of the plurality of pixel walls located in the pixel defining layer and the first organic layer, the inorganic layer including a plurality of second protrusions; the second protrusions are located on a side of the inorganic layer away from the first organic layer; and each of the second protrusions corresponds to each of the first protrusions.

The inorganic layer includes a plurality of microgrooves located at the center of the inorganic layer facing the pixel wall.

The display panel includes a second organic layer on the inorganic layer, and the second organic layer covers the microgrooves.

The display device of the present disclosure includes the above display panel.

In the display panel preparation method according to the present disclosure, a protection layer is first prepared on the pixel defining layer, and then the microstructures are printed on the light-emitting layer in the pixel defining area after the light-emitting layer is subsequently formed. Then preparing an inorganic layer thereon, grooving the center of the pixel defining layer of the inorganic layer, and then preparing the organic layer to realize micro-encapsulation of the display panel. The interference effect of the microgrooves in the conventional thin film package on the light emitted by the OLED is improved, thereby improving the light-emitting efficiency and the flexible display effect of the display panel.

BRIEF DESCRIPTION OF THE DRAWINGS

To describe the technical solutions in the embodiments of the present disclosure or in the prior art more clearly, the following briefly introduces the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

DETAILED DESCRIPTION OF PREFERRED EMBODIMENTS

The technical solutions in the embodiments of the present disclosure will be described clearly and completely hereinafter with reference to the accompanying drawings in the embodiments of the present disclosure. Apparently, the described embodiments are merely some but not all of the embodiments of the present disclosure. All other embodiments obtained by persons of ordinary skill in the art based on the embodiments of the present disclosure without creative efforts shall fall within the protection scope of the present disclosure.

Figure 1:
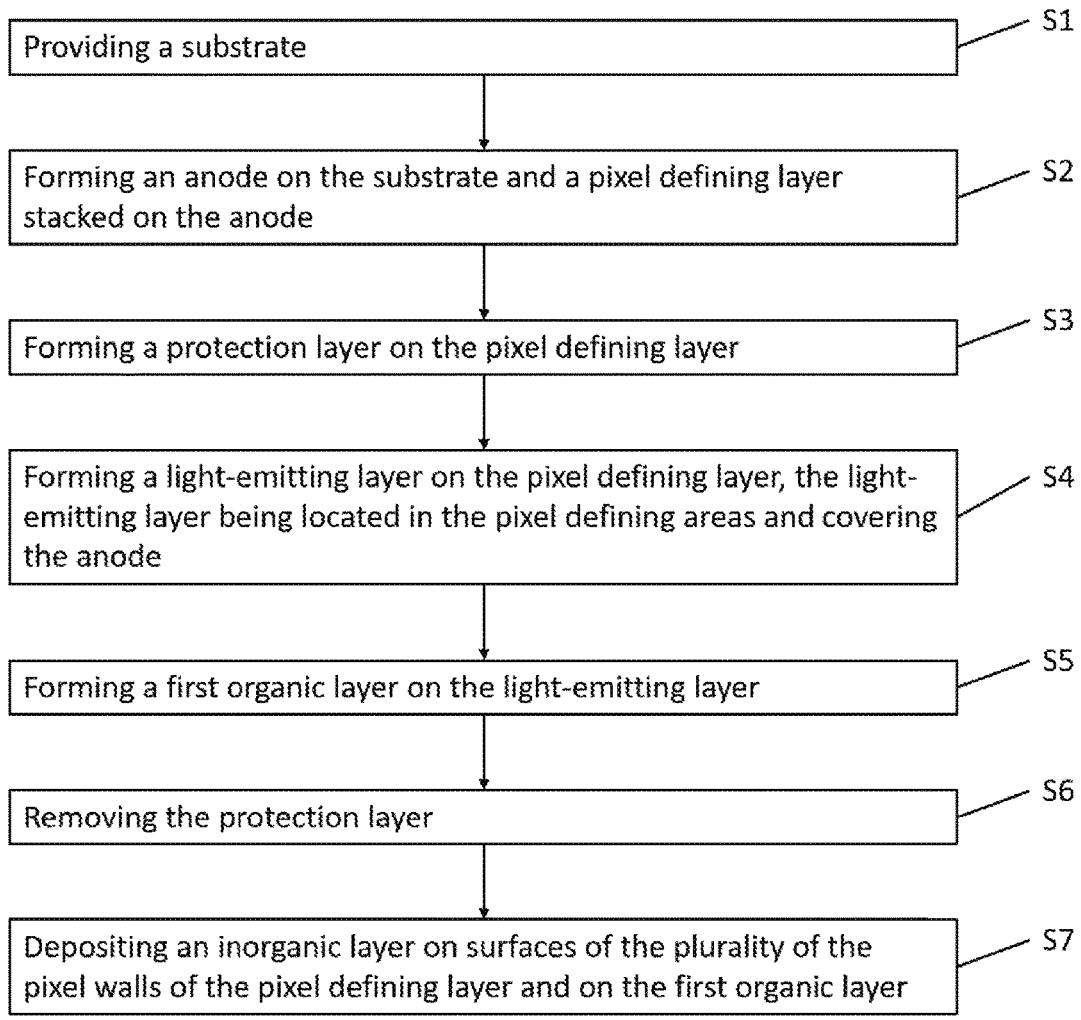
FIG. 1 is a flowchart of a display panel preparation method of the present disclosure.

Referring to FIG. 1, a preferred embodiment of the present disclosure provides a display panel preparation method for fabricating an OLED panel, improving a film packaging structure of the OLED panel, and improving display quality. The method includes the following steps.

Figure 2:
FIG. 2 is a schematic diagram of the structure of the substrate in the display panel preparation method of FIG. 1.

In conjunction with FIG. 2. Step S1. Providing a substrate 10. In this embodiment, the substrate 10 is made of a flexible material.

Figure 3:
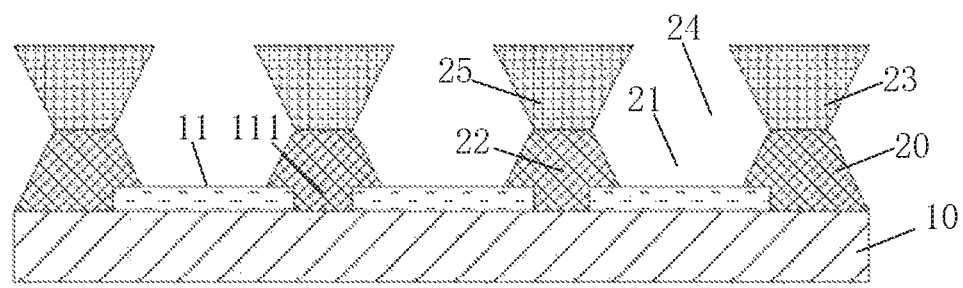
FIG. 3 is a schematic diagram of forming the pixel defining layer and the protection layer in the display panel preparation method of FIG. 1.

Referring to FIG. 3 together with Step S2. Forming an anode 11 on the substrate 10 and a pixel defining layer 20 stacked on the anode 11. The pixel defining layer 20 includes a plurality of pixel walls 22 and the pixel defining areas 21 between every two of the pixel walls 22, and the anode 11 exposes the pixel defining areas 21. Specifically, a metal layer is first formed on the substrate 10, the metal layer is patterned to form the anode 11. The anode 11 includes a plurality of grooves 111 arranged at intervals. And then the pixel material layer is formed by a film-forming process such as plasma enhanced chemical vapor deposition (PECVD), atomic layer deposition (ALD), or physical vapor deposition (PVD). A pixel defining layer 20 is formed on the pixel material layer by a process of coating with glue, exposure, development, etching and the like. The pixel walls 22 cover the grooves 111 and protrudes from the anode 11. The pixel defining areas 21 are located directly above the anode 11. In this embodiment, the pixel material layer is made of an inorganic material, and the pixel walls 22 have a trapezoidal structure.

Referring to FIG. 3. Step S3. Forming a protection layer 23 on the pixel defining layer 20. The protection layer 23 includes a plurality of protection walls 25 spaced apart from each other, and a protection area 24 is defined between the two protection walls 25. Each of the protection walls 25 corresponds to one of the pixel walls 22 and is located on a surface of the pixel wall 22. An orthogonal projection of the protection wall 25 on the pixel wall 22 completely covers the pixel wall 22, and the protection areas 24 correspond to the pixel defining areas 21 in one-to-one correspondence. Specifically, an organic material layer is formed on the pixel defining layer 20 by a film-forming process such as PECVD, ALD or PVD, and then the organic material layer is patterned by photolithography to form the protection layer 23. In this embodiment, the protection wall 25 is an inverted trapezoid structure and is mirror-image-symmetric with the pixel wall 22 and completely covers the pixel wall 22. It can be understood that, in other embodiments of the present embodiment, the protection wall 25 may also be other shapes that completely cover the pixel wall 22.

Figure 4:
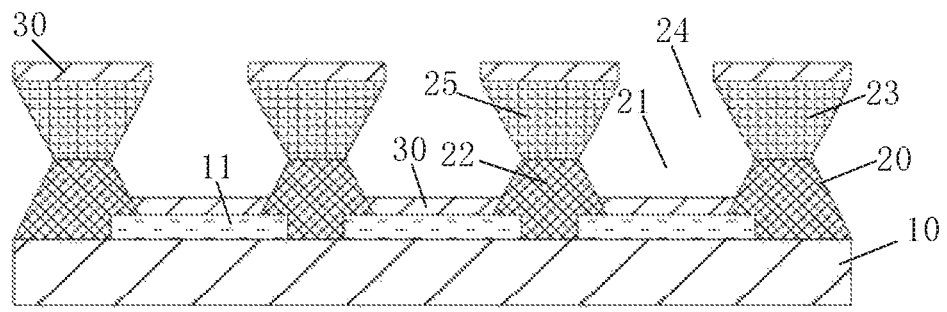
FIG. 4 is a schematic diagram of forming the light-emitting layer in the display panel preparation method of FIG. 1.
Figure 5:
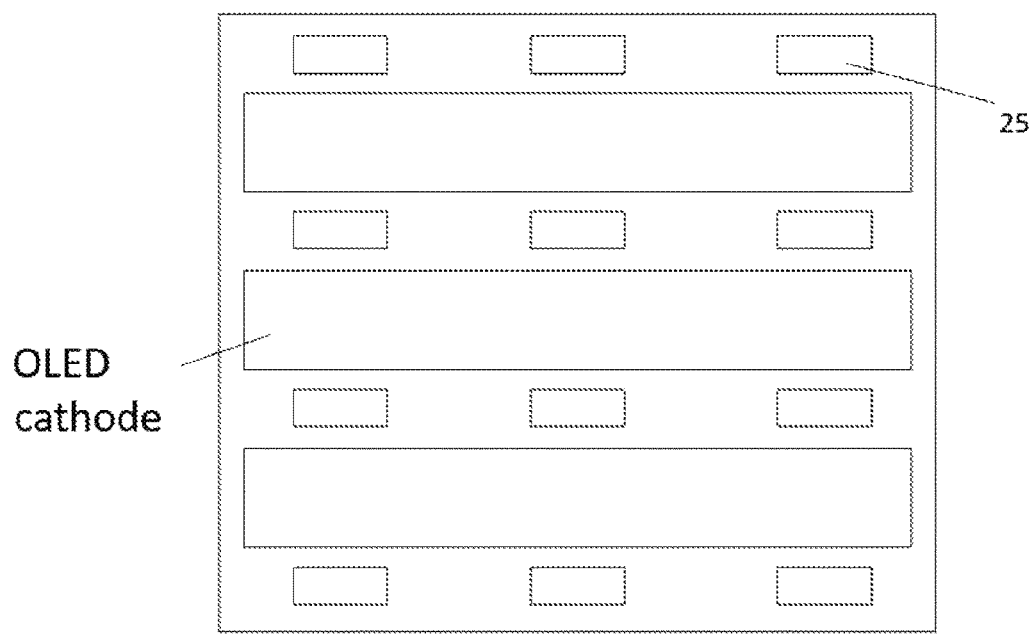
FIG. 5 is a top view of the display panel after the light-emitting layer is formed as shown in FIG. 4.

Referring to FIGS. 4 and 5. Step S4. Forming a light-emitting layer 30 on the pixel defining layer 20. The light-emitting layer 30 is located in the pixel defining area 21 and covers the anode 11. Specifically, the light-emitting layer 30 includes various functional layers of an OLED device structure. That is, the light-emitting layer 20 is an organic light-emitting layer, and the respective functional layers of the OLED device are sequentially deposited on the anode 11 and the protection wall 25 by thermal evaporation to form the light-emitting layer 30. As can be seen from FIG. 6, the protection layer 23 breaks the cathode of the OLED in the light-emitting layer 30, which facilitates the removal of the protection layer 22 in the subsequent process.

Figure 6:
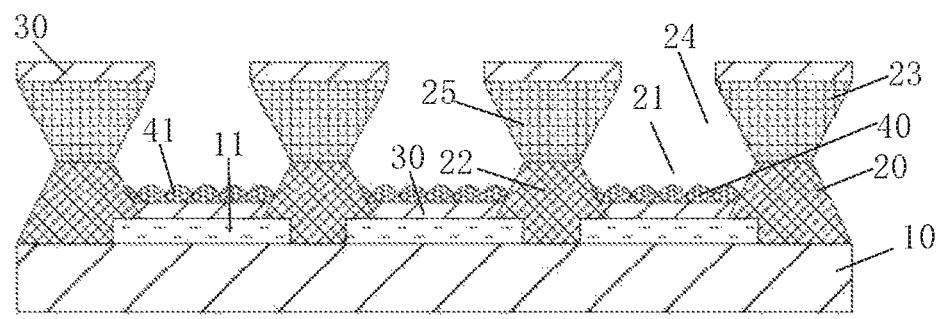
FIG. 6 is a schematic diagram of forming the first organic layer in the display panel preparation method of FIG. 1.

Referring to FIG. 6. Step S5. Forming a first organic layer 40 on the light-emitting layer 30. A plurality of first protrusions 41 are formed on a surface of the first organic layer 40. Specifically, an ultraviolet (UV) curable organic material layer is printed on the light-emitting layer 30 by using a precise inkjet printing technique, and the first organic layer 40 having a microstructure is formed by printing while curing. In this embodiment, the organic material layer is an organic material containing a getter and the microstructure is a plurality of first protrusions 41 of the first organic layer 40 away from the surface of the light-emitting layer 30, the first protrusion 41 can effectively eliminate the interference effect of the light emitted by the OLED in the microgroove and improve the light-emitting efficiency of the OLED. And the first organic layer 40 will not be deposited on the pixel defining layer 20 during the forming process because the protection wall 25 formed in Step S3 completely covers the pixel wall 22.

Figure 7:
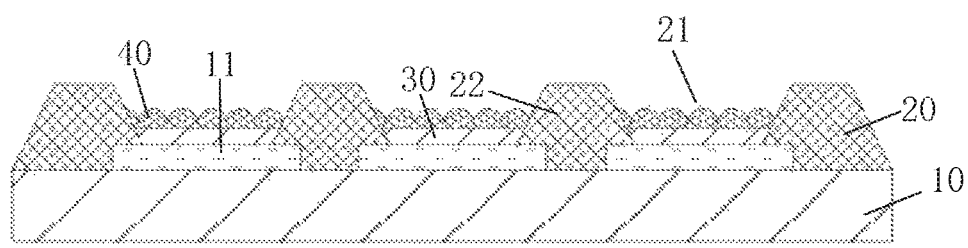
FIG. 7 is a schematic diagram of removing the protection layer in the display panel preparation method of FIG. 1.

Referring to FIG. 7. Step S6. Removing the protection layer 23. In this embodiment, the protection layer 23 blocks the cathode of the OLED in the light-emitting layer 30. The protection wall 25 of the inverse trapezoidal design in the protection layer 23 adopts the stripping process of photolithography technology, and the protection layer 23 can be conveniently removed from the pixel defining layer 20.

Figure 8:
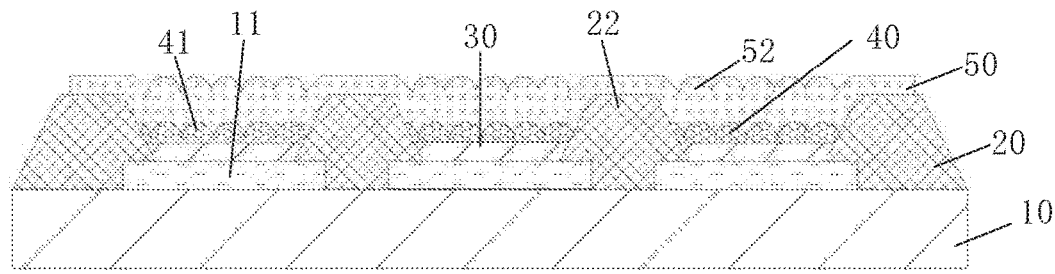
FIG. 8 is a schematic diagram of forming the inorganic layer in the display panel preparation method of FIG. 1.

Referring to FIG. 8. Step S7. Depositing an inorganic layer 50 on the surfaces of the plurality of pixel walls 22 of the pixel defining layer 20 and the first organic layer 40. Specifically, an inorganic thin film made of an inorganic material such as SiNx, $Al_2O_3$, or $SiO_2$ is deposited to form the inorganic layer 50 by using a film forming process such as PECVD, ALD, or PVD, and completing step S6. In this embodiment, the inorganic layer 50 covers the plurality of pixel walls 22 and the first organic layer 40 of the pixel defining layer 20, and the inorganic layer 50 is an inorganic thin film, the inorganic thin film is formed along the protrusions 41 during the deposition process, and the inorganic thin film is not filled with advection during the formation process. Therefore, a plurality of second protrusions 52 are formed on a surface of the inorganic thin film located on the plurality of first protrusions 41 of the first organic layer 40 away from the first organic layer 40. Each of the second protrusions 52 corresponding to each of the first protrusions 41 can eliminate the interference caused by the microgrooves and the light emitted by the OLED and improve the light-emitting efficiency and the flexible display effect of the OLED.

Figure 9:
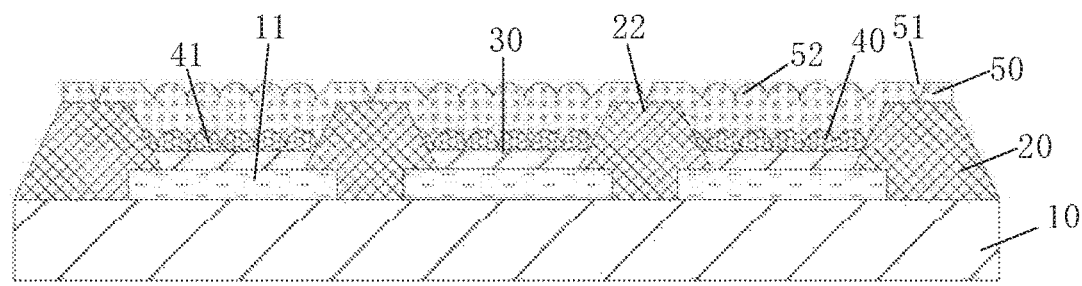
FIG. 9 is a schematic diagram of forming microgrooves in the display panel preparation method of FIG. 1.

The display panel preparation method further includes etching the microgrooves 51 on the inorganic layer 50, as shown in FIG. 9. Specifically, the process of coating, exposing, developing, etching and the like using photolithography is performed to etch the microgrooves 51 on the inorganic layer 50 located at the center of the pixel wall 22 based on the completion of step S7. The microgrooves 51 are arranged in an array on the inorganic layer 50. The microgrooves 51 extend to the surface of the pixel wall 22 away from the substrate 10. The micro-grooves 51 can reduce the brittle stretching of the inorganic layer 50 during the subsequent bending of the display panel, thereby reducing the bending radius of the flexible display panel and improving the display flexibility of the display panel.

Figure 10:
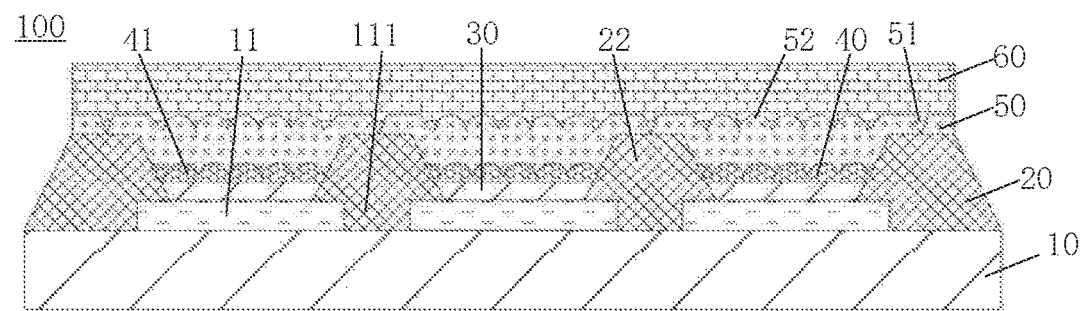
FIG. 10 is a schematic structural diagram of the display panel of the present disclosure.

The display panel preparation method further includes spraying an organic material layer on the inorganic layer 50 to form a second organic layer 60 covering the microgrooves 51 to obtain a display panel 100 as shown in FIG. 10. Specifically, the second organic layer 60 made of an organic material containing a water-absorbing agent is printed on the basis of completing the etching of the microgrooves 51 by using a precise ink-jet printing technology to finally obtain the display panel 100. In this embodiment, the OLED encapsulation layer is formed by the first organic layer 40, the inorganic layer 50 and the organic layer 60, so as to effectively prevent moisture and oxygen in the external space from attacking the OLED device.

The display panel preparation method of the present disclosure encapsulates the OLED device in a micro film encapsulation manner to form a microstructure on the light-emitting layer of the pixel defining area, the microstructure can effectively eliminate the interference of light emitted by the microgrooves in the traditional film packaging structure to the OLED, reduce the problems of low light extraction efficiency and deviation of the CIE of the emergent light generated by the traditional film packaging, thus improving the light-emitting efficiency of the OLED and the flexible display effect of the OLED.

Referring to FIG. 10, the present disclosure provides a display panel 100. The display panel 100 is specifically an OLED panel. The display panel 100 includes a substrate 10, an anode 11, a pixel defining layer 20, a light-emitting layer 30, a first organic layer 40 and an inorganic layer 50.

Specifically, the substrate 10 is a flexible substrate. The anode 11 is located on the substrate 10, and the anode 11 includes a plurality of grooves 111 spaced apart. The pixel defining layer 20 is stacked on the anode 11, and the pixel defining layer 20 includes a plurality of pixel walls 22 arranged in intervals and pixel defining areas 21 between every two of the pixel walls 22. The pixel walls 22 cover the grooves 111 and protrudes from the anode 11. The anode 11 exposes the pixel defining areas 21, and the pixel defining areas 21 are located directly above the anode 11. The light-emitting layer 30 is located on the pixel defining layer 20. The light-emitting layer 30 is located in the pixel defining areas 21 and covers the anode 11. The light-emitting layer 30 includes various functional layers of the OLED device structure.

The first organic layer 40 is located on the light-emitting layer 30, the first organic layer 40 includes a plurality of first protrusions 41. The first protrusions 41 are disposed on a surface of the first organic layer 40 away from the light-emitting layer 30. In this embodiment, the first protrusion 41 is semicircular spherical, the height of the first protrusion 41 is about 1 micrometer, which may be slightly higher than the height of the pixel wall 22, the first protrusion 41 can effectively eliminate the interference effect caused by the light emitted by the OLED in the microgroove and prolong the service life of the display panel. The first organic layer 40 is made of an organic material containing a water-absorbing agent, which can effectively prevent water and oxygen from attacking the OLED after film encapsulation of the OLED. It can be understood that, in other embodiments of the present embodiment, the first protrusions 41 may be spherical, oval or semi-oval.

The inorganic layer 50 is located on the surfaces of the plurality of pixel walls 22 of the pixel defining layer 20 and the first organic layer 40, the inorganic layer 50 includes a plurality of second protrusions 52. The second protrusions 52 are located on a surface of the inorganic layer 50 away from the first organic layer 40. Each of the second protrusions 52 corresponds to each of the first protrusions 41. The second protrusions 52 also can eliminate the interference caused by the microcavities and the light emitted by the OLED to improve the light-emitting efficiency of the display panel. The inorganic layer 50 further includes a plurality of microgrooves 51. The microgrooves 51 are located at the center of the inorganic layer 50 facing the pixel wall 22. The microgrooves 51 penetrate the surface of the pixel defining layer 20 to reduce the stretching of the inorganic layer 50 during the bending of the display panel, which is beneficial for reducing the bending radius of the display panel.

The display panel 100 further includes a second organic layer 60 on the inorganic layer 50. The second organic layer 60 covers the microgrooves 51. The first organic layer 40, the inorganic layer 50, and the second organic layer 60 together form an encapsulation layer of the display panel 100 to prevent the display panel 100 from being attacked by moisture and oxygen. In this embodiment, the second organic layer 60 is made of an organic material containing a water-absorbing agent. The water-absorbing agent can effectively prevent moisture and oxygen from attacking the OLED after the film is encapsulated in the OLED.

In the display panel of the present disclosure, an organic micro-structure is formed on the light-emitting layer in the pixel defining area to effectively improve the effect of the microgroove in the conventional display panel, thereby improving the light output efficiency of the display panel and the flexible display effect, thereby improving the competitiveness of the product.

The present disclosure also provides a display device, which includes the above display panel.

The above disclosure is only the preferred embodiments of the present disclosure, and certainly can not be used to limit the scope of the present disclosure. People of ordinary skill in the art may understand that all or part of the procedures for implementing the foregoing embodiments and equivalent changes made according to the claims of the present disclosure still fall within the scope of the present disclosure.

What is claimed is:

1. A display panel preparation method; comprising:
providing a substrate;
forming an anode on the substrate and a pixel defining layer stacked on the anode, wherein the pixel defining layer comprises a plurality of pixel walls and pixel defining areas between every two of the pixel walls; and the anode exposes the pixel defining areas;
forming a protection layer on the pixel defining layer, wherein the protection layer comprises a plurality of protection walls arranged at intervals, and protection areas is provided between every two adjacent protection walls, each of the protection walls corresponds to one of the pixel walls and located on a surface of the pixel wall, an orthogonal projection of the protection wall on the pixel wall completely covers the pixel wall, the protection areas are in one-to-one correspondence with the pixel defining areas;
forming a light-emitting layer on the pixel defining layer, the light-emitting layer being located in the pixel defining areas and covering the anode;
forming a first organic layer on the light-emitting layer, wherein a plurality of first protrusions are formed on a surface of the first organic layer;
removing the protection layer; and
depositing an inorganic layer on surfaces of the plurality of the pixel walls of the pixel defining layer and on the first organic layer.

2. The display panel preparation method according to claim 1, further comprising:
etching a microgroove on the inorganic layer at a center position of the pixel wall; and
forming a second organic layer on the inorganic layer covering the microgroove.

3. The display panel preparation method according to claim 2, wherein in the step of depositing an inorganic layer on surfaces of the plurality of the pixel walls of the pixel defining layer and on the first organic layer, the inorganic layer is formed by plasma enhanced chemical vapor deposition, atomic layer deposition or physical deposition, wherein a plurality of second protrusions are formed on a surface of the inorganic layer away from the first organic layer, and each of the second protrusions corresponds to each of the first protrusions.

4. The display panel preparation method according to claim 1, wherein in the step of forming an anode on the substrate and a pixel defining layer stacked on the anode, further comprises:
forming a metal layer on the substrate and patterning the metal layer to form the anode, wherein the anode comprises a plurality of grooves arranged at intervals; and
depositing the pixel defining layer on the anode, wherein the pixel wall covers the groove and protrudes from the anode.

5. The display panel preparation method according to claim 1, wherein in the step of forming a first organic layer on the light-emitting layer, the first organic layer is formed by inkjet printing technique.

6. The display panel preparation method according to claim 5, wherein in the step of removing the protection layer, the protection layer is removed by a demolding process.

7. A display panel, comprising:
a substrate;
an anode on the substrate, and a pixel defining layer stacked on the anode, the pixel defining layer comprises a plurality of pixel walls and pixel defining areas between every two of the pixel walls, and the anode exposes the pixel defining areas;
a light-emitting layer on the pixel defining layer, the light-emitting layer being located in the pixel defining areas and covering the anode;
a first organic layer on the light-emitting layer, the first organic layer comprising a plurality of first protrusions; and
an inorganic layer on surfaces of the plurality of pixel walls located in the pixel defining layer and the first organic layer, the inorganic layer comprising a plurality of second protrusions; the second protrusions are located on a side of the inorganic layer away from the first organic layer, and each of the second protrusions corresponds to each of the first protrusions.

8. The display panel according to claim 7, wherein the inorganic layer comprises a plurality of microgrooves located at a center of the inorganic layer facing the pixel wall.

9. The display panel according to claim 8, wherein the display panel comprises a second organic layer on the inorganic layer, and the second organic layer covers the microgrooves.

10. A display device, comprising the display panel of claim 7, the display panel comprising:
a substrate;
an anode on the substrate, and a pixel defining layer stacked on the anode, the pixel defining layer comprises a plurality of pixel walls and pixel defining areas between every two of the pixel walls, and the anode exposes the pixel defining areas;
a light-emitting layer on the pixel defining layer, the light-emitting layer being located in the pixel defining areas and covering the anode;
a first organic layer on the light-emitting layer, the first organic layer comprising a plurality of first protrusions; and
an inorganic layer on surfaces of the plurality of the pixel walls located in the pixel defining layer and the first organic layer, the inorganic layer comprising a plurality of second protrusions, the second protrusions are located on a side of the inorganic layer away from the first organic layer, and each of the second protrusions corresponds to each of the first protrusions.

11. The display device according to claim 10, wherein the inorganic layer comprises a plurality of microgrooves located at a center of the inorganic layer facing the pixel wall.

12. The display device according to claim 10, wherein the display panel comprises a second organic layer on the inorganic layer, and the second organic layer covers the microgrooves.

* * * * *